United States Patent
Hirano et al.

(10) Patent No.: US 10,727,081 B2
(45) Date of Patent: Jul. 28, 2020

(54) METHOD FOR MANUFACTURING PACKAGE SUBSTRATE FOR MOUNTING A SEMICONDUCTOR DEVICE, AND METHOD FOR MANUFACTURING SEMICONDUCTOR DEVICE MOUNTING SUBSTRATE

(71) Applicant: MITSUBISHI GAS CHEMICAL COMPANY, INC., Tokyo (JP)

(72) Inventors: Syunsuke Hirano, Yamagata (JP); Yoshihiro Kato, Yamagata (JP); Takaaki Ogashiwa, Yamagata (JP); Kazuaki Kawashita, Yamagata (JP); Youichi Nakajima, Yamagata (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 16/314,568

(22) PCT Filed: Jun. 23, 2017

(86) PCT No.: PCT/JP2017/023237
§ 371 (c)(1),
(2) Date: Dec. 31, 2018

(87) PCT Pub. No.: WO2018/003703
PCT Pub. Date: Jan. 4, 2018

(65) Prior Publication Data
US 2019/0148169 A1 May 16, 2019

(30) Foreign Application Priority Data

Jul. 1, 2016 (JP) .................................. 2016-131702
Jan. 17, 2017 (JP) .................................. 2017-005949

(51) Int. Cl.
*H01L 21/48* (2006.01)
*B32B 15/08* (2006.01)
(Continued)

(52) U.S. Cl.
CPC .......... *H01L 21/4857* (2013.01); *B32B 15/08* (2013.01); *B32B 15/20* (2013.01);
(Continued)

(58) Field of Classification Search
None
See application file for complete search history.

(56) References Cited

U.S. PATENT DOCUMENTS

2004/0134682 A1* 7/2004 En ........................ C23C 18/1607
174/258
2016/0066433 A1* 3/2016 Kobayashi ........ H01L 23/49822
174/255

(Continued)

FOREIGN PATENT DOCUMENTS

JP 2005-101137 4/2005
JP 2009-032918 2/2009

(Continued)

OTHER PUBLICATIONS

Nikkei Materials and Technology, vol. 94.4 (No. 140), pp. 18 and 19.
(Continued)

*Primary Examiner* — Asok K Sarkar
(74) *Attorney, Agent, or Firm* — Greenblum & Bernstein P.L.C.

(57) ABSTRACT

A method for manufacturing a package substrate for mounting a semiconductor device, including a substrate forming step (a) of forming a supporting substrate for circuit formation including a first insulating resin layer, a release layer including at least a silicon compound, and ultrathin copper foil having a thickness of 1 μm to 5 μm, in this order; a first wiring conductor forming step (b) of forming a first wiring conductor on the ultrathin copper foil of the supporting substrate for circuit formation by pattern copper electroplat- (Continued)

ing; a lamination step (c) of disposing a second insulating resin layer so as to be in contact with the first wiring conductor, and heating and pressurizing the second insulating resin layer for lamination; a second wiring conductor forming step (d) of forming in the second insulating resin layer a non-through hole reaching the first wiring conductor and connecting an inner wall of the non-through hole.

13 Claims, 6 Drawing Sheets

(51) Int. Cl.
| | |
|---|---|
| *H05K 3/46* | (2006.01) |
| *H01L 23/498* | (2006.01) |
| *B32B 15/20* | (2006.01) |
| *C23C 18/38* | (2006.01) |
| *C23F 17/00* | (2006.01) |
| *C25D 7/00* | (2006.01) |

(52) U.S. Cl.
CPC ......... *H01L 23/49822* (2013.01); *H05K 3/46* (2013.01); *B32B 2457/08* (2013.01); *C23C 18/38* (2013.01); *C23F 17/00* (2013.01); *C25D 7/00* (2013.01)

(56) References Cited

U.S. PATENT DOCUMENTS

2017/0362733 A1\* 12/2017 Kohiki ..................... H05K 3/20
2018/0206345 A1\* 7/2018 Yoneda ................... B32B 15/08

FOREIGN PATENT DOCUMENTS

| WO | 2012043742 A | 4/2012 |
| WO | 2014/054812 | 4/2014 |

OTHER PUBLICATIONS

Mitsuyasu Matsuo et al., "Smallest Flip-Chip-Like Package 'Chip Scale Package (CSP)'", The Second VLSI Packaging Workshop of Japan, 1994, pp. 46-50.
International Search Report issued in International Application No. PCT/JP2017/023237, dated Sep. 5, 2017.
International Preliminary Report on Patentability issued in International Application No. PCT/JP2017/023237, dated Jan. 1, 2019.

\* cited by examiner

[Figure1]
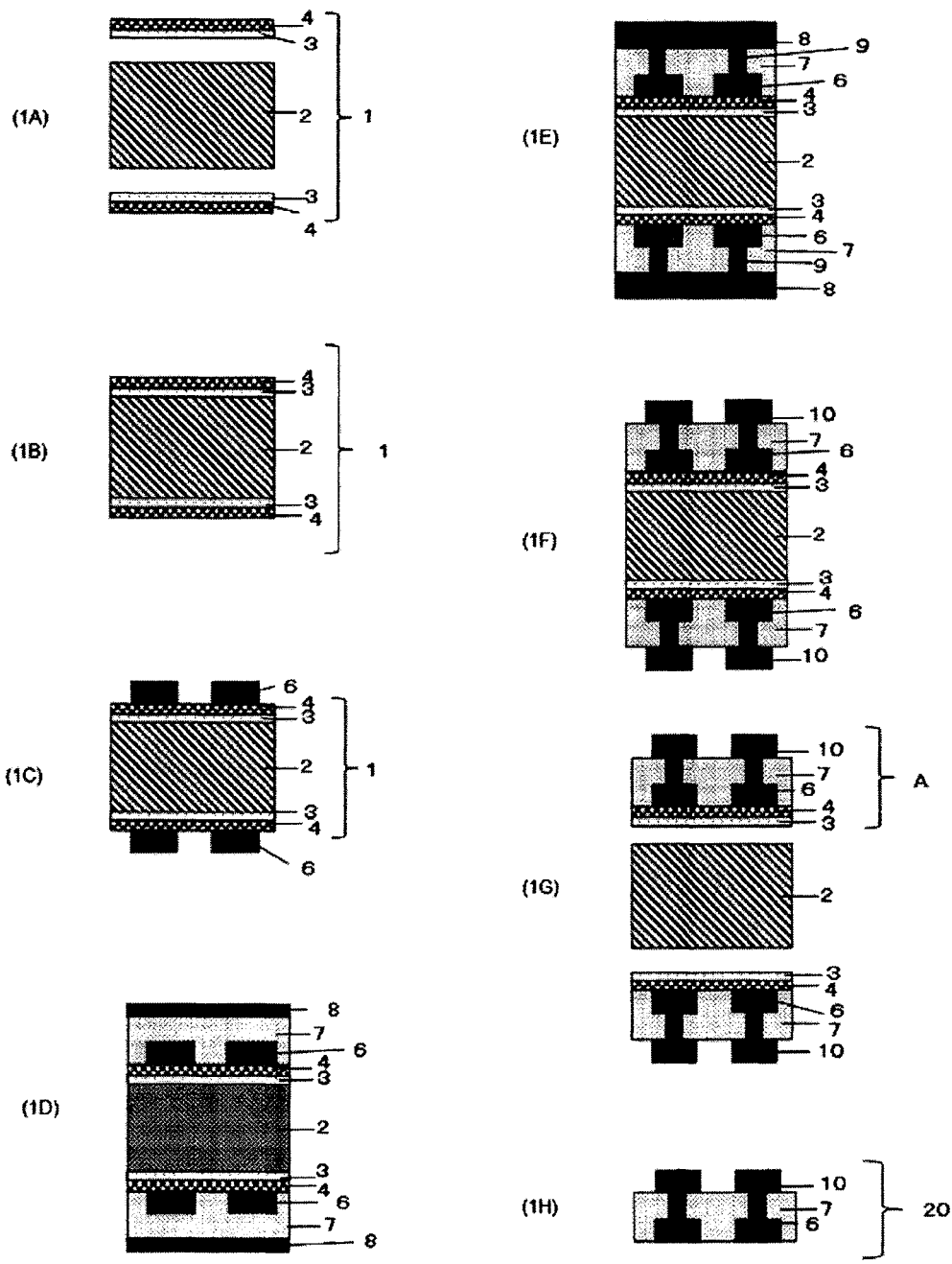

[Figure2]
(2A) 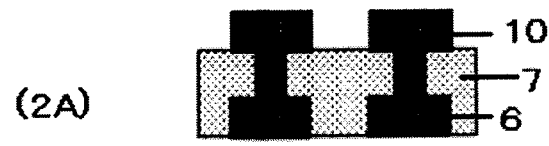
(2B) 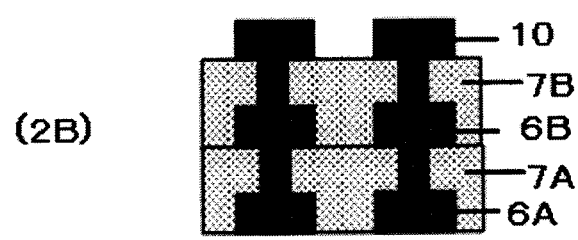
(2C) 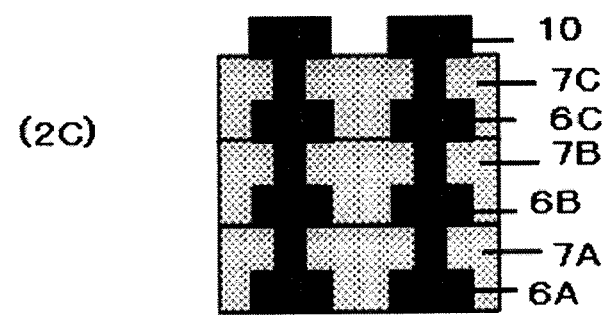

[Figure3]
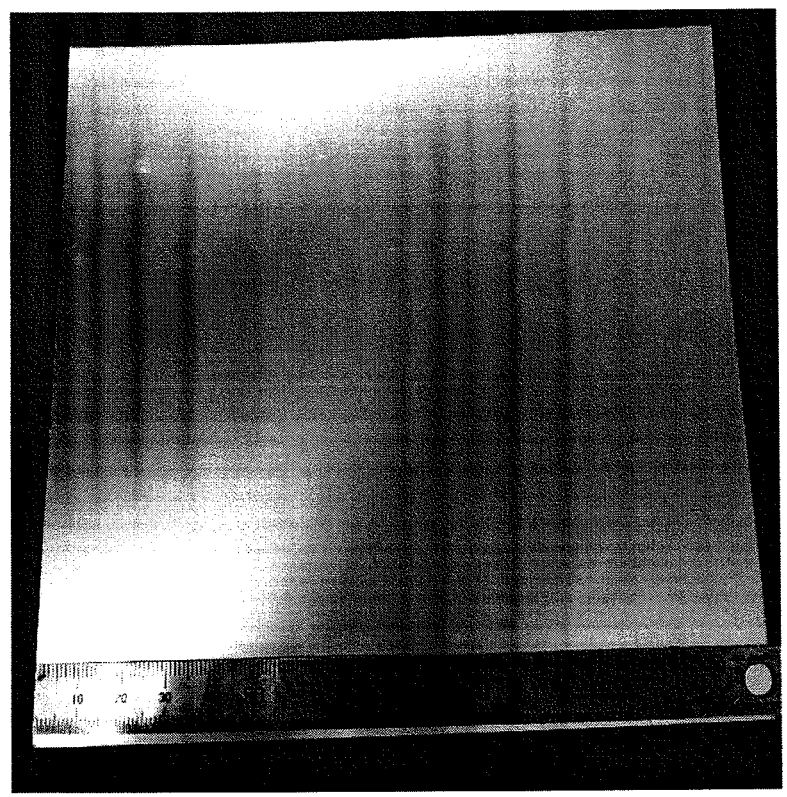

[Figure4]
(4A)
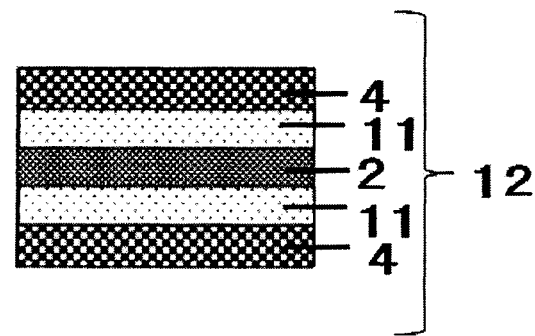
(4B)
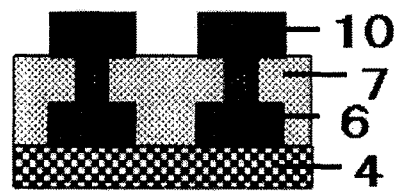
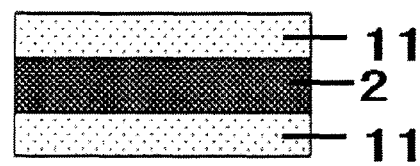
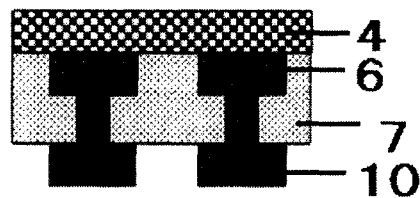

[Figure5]
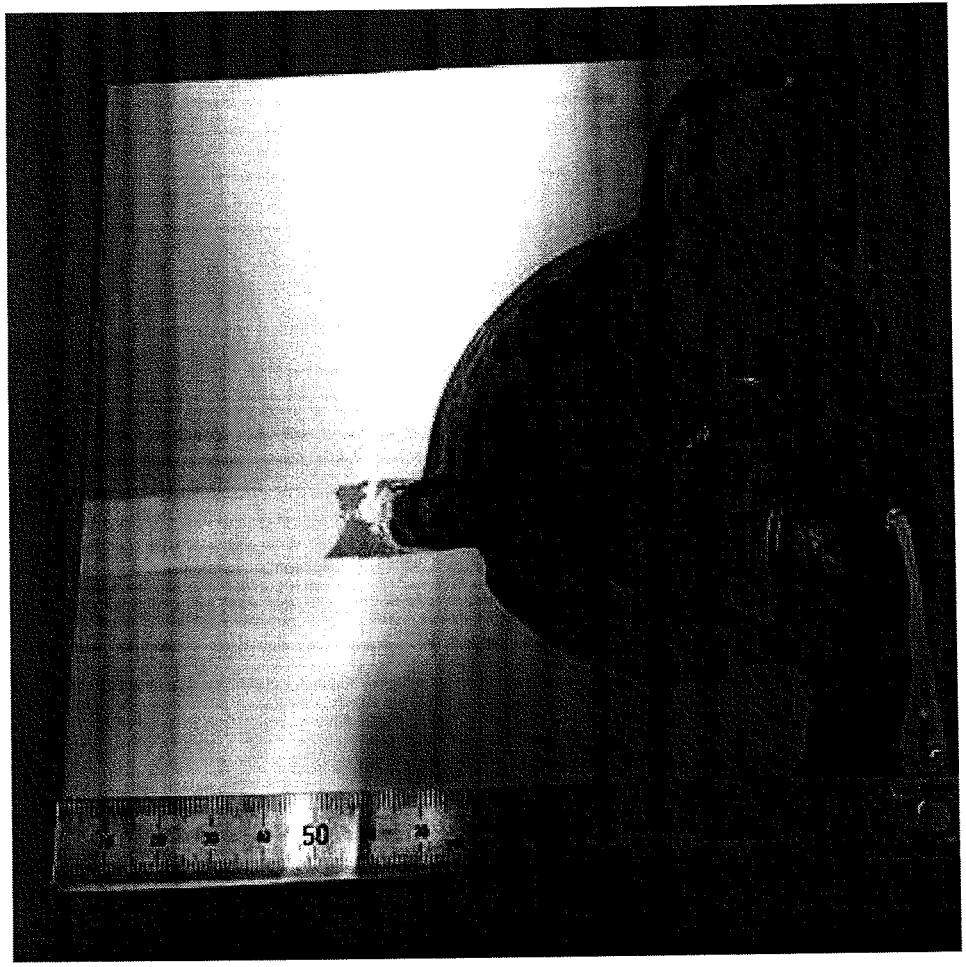

[Figure6]
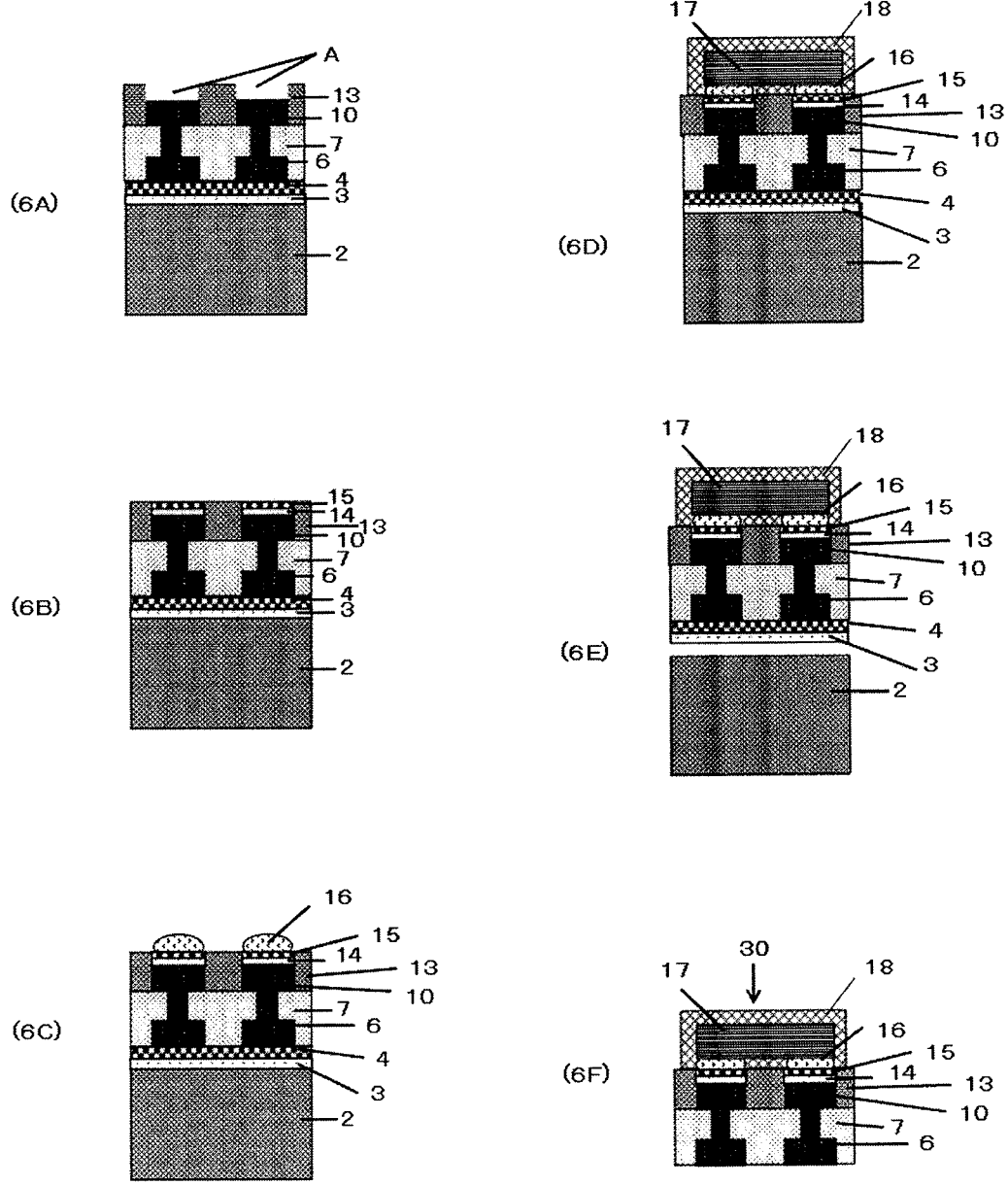

METHOD FOR MANUFACTURING PACKAGE SUBSTRATE FOR MOUNTING A SEMICONDUCTOR DEVICE, AND METHOD FOR MANUFACTURING SEMICONDUCTOR DEVICE MOUNTING SUBSTRATE

TECHNICAL FIELD

The present invention relates to a method for manufacturing a package substrate for mounting a semiconductor device, and a method for manufacturing a semiconductor device mounting substrate.

BACKGROUND ART

In recent years, the size reduction, weight reduction, and multifunctionalization of electronic equipment have proceeded considerably. With the size reduction of electronic equipment, the demand for further size reduction of package size becomes strong. As a product that addresses the size reduction of package size, the so-called Chip Size/Scale Package (CSP) having a size substantially equal to that of a semiconductor chip is proposed. This is a package having connection portions to an external wiring substrate in the mounting region rather than the peripheral portion of a semiconductor chip. Specific examples include one obtained by adhering a bump-attached polyimide film to a surface of a semiconductor chip, making electrical connections with the chip and gold leads, and then performing potting sealing with an epoxy resin (see the following Non Patent Literature 1), and one obtained by forming metal bumps on a temporary substrate at positions corresponding to connection portions to a semiconductor chip and an external wiring substrate, face-down-bonding the semiconductor chip, and then performing transfer molding on the temporary substrate (see the following Non Patent Literature 2).

On the other hand, regarding the formation of fine wiring, attention is paid to a semi-additive method in which a relatively thin plating layer is formed on a base material surface, a plating resist is formed thereon, a conductor is formed to a necessary thickness by electroplating, then the resist is peeled, and then the thin plating layer is removed by soft etching. In addition, a method of forming carrier-attached peelable copper foil formed by a heating-pressurization pressing method, instead of a thin plating layer, and then removing the carrier to form a thin copper foil layer is also studied.

In addition, for the purpose of providing a method for manufacturing a package substrate for mounting a semiconductor device having excellent wiring density and excellent production efficiency and high connection reliability, a method is proposed in which a supporting substrate for circuit formation obtained by providing an insulating resin on the carrier copper foil surface of carrier copper foil-attached ultrathin copper foil having an ultrathin copper foil thickness of 1 μm to 5 μm is used, a wiring conductor is fabricated on the supporting substrate for circuit formation using copper electroplating or the like, and then the carrier copper foil-attached supporting substrate is peeled to fabricate a package substrate for mounting a semiconductor device (for example, see the following Patent Literature 1).

CITATION LIST

Patent Literature

Patent Literature 1: Japanese Patent Laid-Open No. 2005-101137

Non Patent Literature

Non Patent Literature 1: NIKKEI MATERIALS & TECHNOLOGY 94.4, No. 140, p 18-19
Non Patent Literature 2: Smallest Flip-Chip-Like Package CSP; The Second VLSI Packaging Workshop of Japan, p 46-50, 1994

SUMMARY OF INVENTION

Technical Problem

In the supporting substrate for circuit formation using the carrier copper foil-attached ultrathin copper foil used in the method for manufacturing a package substrate for mounting a semiconductor device in Patent Literature 1 described above, usually, an ultrathin adhesive layer is often provided between (at the interface between) the carrier copper foil and the ultrathin copper foil. But, usually, the adhesive layer has a thickness of several tens of nm and has weak resistance to chemicals. For example, when a package substrate having a multilayer structure is fabricated, holes such as through holes may be made by a drill or a laser for interlayer connection. At this time, in order to remove the resin (smears) remaining in the interiors of the holes, and the like, desmear treatment for removing smears is performed using desmear liquid comprising sodium permanganate and the like. But, when the supporting substrate for circuit formation using the carrier copper foil-attached ultrathin copper foil as described above is used, the chemical solution (desmear liquid) may penetrate the adhesive layer located between the carrier copper foil and the ultrathin copper foil. When the chemical solution penetrates the adhesive layer between the carrier copper foil and the ultrathin copper foil in this manner, the adhesion strength at the interface between the carrier copper foil and the ultrathin copper foil decreases. The decrease in adhesion strength at the interface between the carrier copper foil and the ultrathin copper foil influences production efficiency. In addition, when the portion where the penetration of the chemical solution occurs extends to a portion to be a product, the ultrathin copper foil is corroded by the chemical solution, which may cause product failure. Further, the occurrence of the infiltration of the chemical solution causes the contamination of liquids and apparatuses used in subsequent steps, also causing apparatus malfunctions.

In addition, conventionally, in order to prevent the infiltration of the chemical solution, when a package substrate is fabricated, a supporting substrate for circuit formation is often formed so that the side surfaces of the carrier copper foil-attached ultrathin copper foil are covered with an insulating resin. But, in order to cover the side surfaces of the carrier copper foil-attached ultrathin copper foil, it is necessary to make small the supporting substrate for circuit formation (detachable core) that is the base, and another problem is that the flexibility of design is inhibited.

In addition, a case where from the viewpoint of handling properties and the like, mounting a semiconductor device on a substrate in the process of a method for manufacturing a package substrate for mounting a semiconductor device is desired is also assumed. But, when an attempt is made to mount a semiconductor device on a substrate in the process of a conventional method, the so-called blister often occurs between the metal layer and the ultrathin copper foil, and the like during the reflow of solder or the like, and the development of means that can also mount a semiconductor device on a substrate in the process of a method for manufacturing a package substrate for mounting a semiconductor device has been required.

In order to solve the-described problems, it is an object of the present invention to provide a method for manufacturing a package substrate for mounting a semiconductor device and a method for manufacturing a semiconductor device mounting substrate that have good production efficiency and high flexibility of design.

Solution to Problem

<1> A method for manufacturing a package substrate for mounting a semiconductor device, comprising: a substrate forming step (a) of forming a supporting substrate for circuit formation comprising a first insulating resin layer, a release layer comprising at least a silicon compound, and ultrathin copper foil having a thickness of 1 µm to 5 µm, in this order; a first wiring conductor forming step (b) of forming a first wiring conductor on the ultrathin copper foil of the supporting substrate for circuit formation by pattern copper electroplating; a lamination step (c) of disposing a second insulating resin layer so as to be in contact with the first wiring conductor, and heating and pressurizing the second insulating resin layer for lamination; a second wiring conductor forming step (d) of forming in the second insulating resin layer a non-through hole reaching the first wiring conductor and connecting an inner wall of the non-through hole by copper electroplating and/or electroless copper plating to form a second wiring conductor; a peeling step (e) of peeling the first insulating resin layer from the supporting substrate for circuit formation on which the first wiring conductor and the second wiring conductor are formed; and a removal step (f) of removing the release layer and/or the ultrathin copper foil.

<2> The method for manufacturing a package substrate for mounting a semiconductor device according to <1>, wherein the first wiring conductor forming step (b) comprises a step (b-1) of laminating a plating resist on the ultrathin copper foil, a step (b-2) of forming a wiring circuit pattern in the plating resist by photolithography, a step (b-3) of forming the first wiring conductor by pattern copper electroplating on the ultrathin copper foil on which the wiring circuit pattern is formed, and a step (b-4) of removing the plating resist.

<3> The method for manufacturing a package substrate for mounting a semiconductor device according to <1> or <2>, wherein the lamination step (c) comprises a step (c-1) of subjecting a surface of the first wiring conductor to roughening treatment, and a step (c-2) of disposing the second insulating resin layer so as to be in contact with the first wiring conductor subjected to the roughening treatment, further disposing a metal layer on the second insulating resin layer, and performing heating and pressurization to laminate the second insulating resin layer and the metal layer.

<4> The method for manufacturing a package substrate for mounting a semiconductor device according to any one of <1> to <3>, wherein the second wiring conductor forming step (d) comprises a step (d-1) of forming in the second insulating resin layer a non-through hole reaching the first wiring conductor, a step (d-2) of connecting an inner wall of the non-through hole by copper electroplating and/or electroless copper plating, and a step (d-3) forming the second wiring conductor by a subtractive method or a semi-additive method.

<5> The method for manufacturing a package substrate for mounting a semiconductor device according to any one of <1> to <4>, wherein in the second wiring conductor forming step (d), the supporting substrate for circuit formation on which the first wiring conductor and the second wiring conductor are formed is further repeatedly subjected to the lamination step (c) and the second wiring conductor forming step (d) to manufacture a package substrate for mounting a semiconductor device having a buildup structure.

<6> The method for manufacturing a package substrate for mounting a semiconductor device according to any one of <1> to <5>, wherein a thickness of the first insulating resin layer is 0.02 mm to 2.0 mm.

<7> The method for manufacturing a package substrate for mounting a semiconductor device according to any one of <1> to <6>, wherein in the second wiring conductor forming step (d), the non-through hole is formed by a laser.

<8> The method for manufacturing a package substrate for mounting a semiconductor device according to any one of <1> to <7>, wherein in the peeling step (e), the first insulating resin layer is physically peeled.

<9> The method for manufacturing a package substrate for mounting a semiconductor device according to any one of <1> to <8>, wherein in the removal step (f), the release layer and/or the ultrathin copper foil are removed using a sulfuric acid-based or hydrogen peroxide-based etchant.

<10> The method for manufacturing a package substrate for mounting a semiconductor device according to any one of <1> to <9>, wherein the substrate forming step (a) comprises a step (a-1) of disposing release layer-attached copper foil in which the release layer is formed on copper foil having a thickness of 1 µm to 20 µm on the first insulating resin layer so that the release layer and the first insulating resin layer are in contact with each other, and then subjecting the copper foil of the release layer-attached copper foil to etching treatment to form the ultrathin copper foil.

<11> The method for manufacturing a package substrate for mounting a semiconductor device according to any one of <1> to <10>, wherein the release layer comprises the silicon compound other than a silicone compound.

<12> The method for manufacturing a package substrate for mounting a semiconductor device according to any one of <1> to <11>, wherein the release layer is directly laminated on the first insulating resin layer.

<13> A method for manufacturing a semiconductor device mounting substrate, comprising a substrate forming step (a) of forming a supporting substrate for circuit formation comprising a first insulating resin layer, a release layer comprising at least a silicon compound, and ultrathin copper foil having a thickness of 1 µm to 5 µm, in this order; a first wiring conductor forming step (b) of forming a first wiring conductor on the ultrathin copper foil of the supporting substrate for circuit formation by pattern copper electroplating; a lamination step (c) of disposing a second insulating resin layer so as to be in contact with the first wiring conductor, and heating and pressurizing the second insulating resin layer for lamination; a second wiring conductor forming step (d) of forming in the second insulating resin layer a non-through hole reaching the first wiring conductor and connecting an inner wall of the non-through hole by copper electroplating and/or electroless copper plating to form a second wiring conductor; a semiconductor device mounting step (g) of mounting a semiconductor device on the second wiring conductor; a peeling step (e) of peeling the first insulating resin layer from the supporting substrate for circuit formation on which the semiconductor device is mounted on the second wiring conductor; and a removal step (f) of removing the release layer and/or the ultrathin copper foil.

<14> The method for manufacturing a semiconductor device mounting substrate according to <13>, wherein in the semiconductor device mounting step (g), the semiconductor device is mounted on the second wiring conductor via a joining material.

<15> The method for manufacturing a semiconductor device mounting substrate according to <13> or <14>, wherein the release layer is directly laminated on the first insulating resin layer.

Advantageous Effect of Invention

According to the method for manufacturing a package substrate for mounting a semiconductor device according to the present invention, it is possible to provide a method for manufacturing a package substrate for mounting a semiconductor device and a method for manufacturing a semiconductor device mounting substrate that have good production efficiency and high flexibility of design.

BRIEF DESCRIPTION OF DRAWINGS

FIG. 1 shows schematic diagrams for explaining one embodiment of a method for manufacturing a package substrate for mounting a semiconductor device according to the present invention.

FIG. 2 shows schematic diagrams for explaining variations of package substrates for semiconductor device mounting.

FIG. 3 is a photograph in which the laminate in Example 1 is observed from the release layer side.

FIG. 4 shows schematic diagrams for explaining the supporting substrate for circuit formation and the peeling step in Comparative Example 2.

FIG. 5 is a photograph in which the laminate in Comparative Example 2 is observed from the ultrathin copper foil side.

FIG. 6 shows schematic diagrams for explaining one embodiment of a method for manufacturing a semiconductor device mounting substrate according to the present invention.

DESCRIPTION OF EMBODIMENTS

The present invention will be described below using embodiments as examples. However, the embodiments of the present invention are not limited to the embodiments described below.

The method for manufacturing a package substrate for mounting a semiconductor device in this embodiment (hereinafter sometimes simply referred to as "the manufacturing method in this embodiment") comprises:

the substrate forming step (a) of forming a supporting substrate for circuit formation comprising a first insulating resin layer, a release layer comprising at least a silicon compound, and ultrathin copper foil having a thickness of 1 μm to 5 μm, in this order;

the first wiring conductor forming step (b) of forming a first wiring conductor on the ultrathin copper foil of the supporting substrate for circuit formation by pattern copper electroplating;

the lamination step (c) of disposing a second insulating resin layer so as to be in contact with the first wiring conductor, and heating and pressurizing the second insulating resin layer for lamination;

the second wiring conductor forming step (d) of forming in the second insulating resin layer a non-through hole reaching the first wiring conductor and connecting the inner wall of the non-through hole by copper electroplating and/or electroless copper plating to form a second wiring conductor;

the peeling step (e) of peeling the first insulating resin layer from the supporting substrate for circuit formation on which the first wiring conductor and the second wiring conductor are formed; and the removal step (f) of removing the release layer and/or the ultrathin copper foil.

In the method for manufacturing a package substrate for mounting a semiconductor device in this embodiment, the supporting substrate for circuit formation comprises the first insulating resin layer, the release layer comprising at least the silicon compound, and the ultrathin copper foil having a thickness of 1 μm to 5 μm, in this order. The supporting substrate for circuit formation is excellent in adhesion strength (hereinafter sometimes referred to herein as "peel strength") at the interface between the ultrathin copper foil and the first insulating resin layer (for example, a prepreg) (a site where the ultrathin copper foil and the first insulating resin layer are adhered to each other via the release layer), and, for example, the infiltration of a chemical solution into the interface does not occur in desmear treatment either, and the supporting substrate for circuit formation is excellent in chemical resistance such as desmear resistance. The reason why the adhesion strength at the interface between the ultrathin copper foil and first insulating resin layer of the supporting substrate for circuit formation is excellent in the method for manufacturing a package substrate for mounting a semiconductor device in this embodiment is not clear, but the reason is presumed to be due to an anchor effect produced by the fact that several-μm irregularities on the ultrathin copper foil surface penetrate the release layer interposed at the interface and stick into the first insulating resin layer side, and the first insulating resin layer melts when pressed (heated and pressurized). The peel strength can be controlled, for example, by changing the conditions of pressing release layer-attached copper foil (for example, copper foil having a thickness of 1 μm to 20 μm on which the release layer is formed) against the first insulating resin layer when the release layer and the ultrathin copper foil are laminated on the first insulating resin layer using the release layer-attached copper foil. Similarly, the reasons why the supporting substrate for circuit formation is excellent in chemical resistance in the method for manufacturing a package substrate for mounting a semiconductor device in this embodiment are not clear, but, first, the fact that the release layer comprises a compound comprising silicon, which is an inorganic component, is presumed to be one of the reasons. In other words, when carrier copper foil-attached ultrathin copper foil is used as in a conventional case, an adhesive layer is often used between the first insulating resin layer and the ultrathin copper foil, but the adhesive layer is usually organic matter, and therefore may dissolve when a chemical solution for removing smears (organic matter) is used. On the other hand, it is presumed that the release layer in this embodiment comprises a compound comprising silicon, which is an inorganic component, and therefore is less likely to dissolve in a chemical solution used for desmear treatment and can prevent chemical solution infiltration. Further, the adhesion strength at the interface between the ultrathin copper foil and the first insulating resin layer is excellent due to the-described anchor effect, and therefore such a factor is also presumed to be one of the reasons why the infiltration of a chemical solution such as desmear liquid can be prevented.

In addition, in the package substrate for mounting a semiconductor device fabricated by the manufacturing method in this embodiment, by embedding fine wiring in the insulating resin layer, wiring close adhesion strength can also be obtained. Further, according to the manufacturing method in this embodiment, routing is possible with the minimum necessary number of layers, and therefore the number of layers is reduced, a package substrate for mounting a semiconductor device having a smaller total sheet thickness than a conventional one can be fabricated, and the wiring density of the package substrate for mounting a semiconductor device can also be increased.

The manufacturing method in this embodiment will be described in detail below.

[Substrate Forming Step (a)]

The substrate forming step (a) is the step of forming a supporting substrate for circuit formation comprising a first insulating resin layer, a release layer comprising at least a silicon compound, and ultrathin copper foil having a thickness of 1 μm to 5 μm, in this order. The release layer and the ultrathin copper foil may be disposed on only one surface of the first insulating resin layer, but these layers are preferably disposed on both surfaces of the first insulating resin layer. In other words, the supporting substrate for circuit formation in this embodiment is preferably a release layer-attached two-layer core substrate. The configuration of a supporting substrate for circuit formation (release layer-attached two-layer core substrate) 1 will be described using FIG. 1. FIG. 1 shows schematic diagrams for explaining one embodiment of the method for manufacturing a package substrate for mounting a semiconductor device according to the present invention. As shown in FIG. 1A and FIG. 1B, in the supporting substrate for circuit formation 1, release layers 3 and ultrathin copper foil 4 are provided on both surfaces of a first insulating resin layer (for example, a prepreg) 2 in order from the surface sides of the first insulating resin layer 2.

As the method for forming the supporting substrate for circuit formation, the supporting substrate for circuit formation can be formed by forming the release layer on the ultrathin copper foil and disposing this on the first insulating resin layer. But, the method for forming the supporting substrate for circuit formation is not limited to the formation method, and is not particularly limited as long as it is a method in which the release layer and the ultrathin copper foil are laminated on the first insulating resin layer in this order. For example, the release layer and the ultrathin copper foil can be formed on the first insulating resin layer by disposing copper foil having a fixed thickness on which the release layer is formed (hereinafter also referred to herein as "release layer-attached copper foil"), so that the release layer surface is in contact with the first insulating resin layer such as a prepreg, and perform heating and pressurization for lamination. In this case, after the lamination, by performing known treatment such as etching treatment, as needed, so that the copper foil has the desired thickness, the supporting substrate for circuit formation comprising the first insulating resin layer, the release layer comprising at least the silicon compound, and the ultrathin copper foil having a thickness of 1 μm to 5 μm, in this order can be formed. The release layer-attached copper foil is not particularly limited, and, for example, copper foil having a thickness of 1 μm to 20 μm on which the release layer is formed can be used. The supporting substrate for circuit formation may be formed by forming the release layer on the first insulating resin layer and then disposing the ultrathin copper foil.

The method and conditions of lamination are not particularly limited, and, for example, by carrying out vacuum pressing under the conditions of a temperature of 220±2° C., a pressure of 5±0.2 MPa, and a holding time of 60 minutes, the supporting substrate for circuit formation can be formed.

(First Insulating Resin Layer)

The first insulating resin layer in the substrate forming step (a) is not particularly limited, and, for example, a prepreg obtained by impregnating a base material such as glass cloth with an insulating resin material (insulating material) such as a thermosetting resin, and an insulating film material can be used.

The "prepreg" is obtained by impregnating or coating a base material with an insulating material such as a resin composition. The base material is not particularly limited, and well-known ones used in a variety of laminates for electrical insulating materials can be appropriately used. Examples of the material constituting the base material include inorganic fibers of E glass, D glass, S glass Q glass, or the like; organic fibers of polyimides, polyesters, tetrafluoroethylene, or the like; and mixtures thereof. The base material is not particularly limited, and, for example, one having the shape of a woven fabric, a nonwoven fabric, a roving, a chopped strand mat, or a surfacing mat can be appropriately used. The material and shape of the base material are selected depending on the intended application and performance of the molded material, and a single or two or more types of materials and shapes can also be used as needed.

The thickness of the base material is not particularly limited, but usually a 0.02 to 0.50 mm base material can be used. As the base material, one surface-treated with a silane coupling agent or the like, and one mechanically subjected to opening treatment can be used, and these base materials are preferred in terms of heat resistance, moisture resistance, and processability.

The insulating material is not particularly limited, and a known resin composition used as an insulating material of a printed wiring board can be appropriately selected and used. As the resin composition, a thermosetting resin having good heat resistance and chemical resistance can be used as a base. The thermosetting resin is not particularly limited, and phenolic resins, epoxy resins, cyanate resins, maleimide resins, isocyanate resins, benzocyclobutene resins, vinyl resins, and the like can be illustrated. One type of thermosetting resin may be used singly, or two or more types of thermosetting resins may be mixed and used.

Among thermosetting resins, epoxy resins are excellent in heat resistance, chemical resistance, and electrical characteristics and relatively inexpensive and therefore can be preferably used as the insulating material. Examples of the epoxy resins can include bisphenol A-based epoxy resins, bisphenol F-based epoxy resins, bisphenol S-based epoxy resins, alicyclic epoxy resins, aliphatic chain epoxy resins, phenol novolac-based epoxy resins, cresol novolac-based epoxy resins, bisphenol A novolac-based epoxy resins, diglycidyl etherified products of biphenol, diglycidyl etherified products of naphthalenediol, diglycidyl etherified products of phenols, diglycidyl etherified products of alcohols, and alkyl substitution products, halides, and hydrogenation products thereof. One type of epoxy resin may be used singly, or two or more types of epoxy resins may be mixed and used. For the curing agent used with this epoxy resin, one that cures the epoxy resin can be used without limitation. Examples of the curing agent include polyfunctional phenols, polyfunctional alcohols, amines, imidazole compounds, acid anhydrides, organophosphorus compounds, and halides thereof. One type of these epoxy resin curing agents may be used singly, or two or more types of these epoxy resin curing agents may be mixed and used.

The cyanate resins are resins that produce cured products comprising a triazine ring as a repeating unit by heating, and the cured products are excellent in dielectric characteristics. Therefore, the cyanate resins are preferred particularly in a case where high frequency characteristics are required, and the like. The cyanate resins are not particularly limited, and examples thereof include 2,2-bis(4-cyanatophenyl)propane, bis(4-cyanatophenyl)ethane, 2,2-bis(3,5dimethyl-4-cyanatophenyl)methane, 2,2-(4-cyanatophenyl)-1,1,1,3,3,3-hexafluoropropane, α,α'-bis(4-cyanatophenyl)-m-diisopropylbenzene, and cyanate esterified products of phenol novolacs and alkylphenol novolacs. Among them, 2,2-bis(4-cyanatophenyl)propane is particularly good in the balance between the dielectric characteristics and curability of the cured product and also inexpensive in terms of cost and therefore preferred. One type of cyanate resins such as these cyanate ester compounds may be used singly, or two or more types of cyanate resins such as these cyanate ester compounds may be mixed and used. The cyanate ester compounds may be previously partially oligomerized into trimers or pentamers.

Further, a curing catalyst and a curing accelerator can also be used in combination with the cyanate resin. As the curing catalyst, for example, metals such as manganese, iron, cobalt, nickel, copper, and zinc can be used. Specific examples can include organometallic salts such as 2-ethylhexanoates and octylates, and organometallic complexes such as acetylacetone complexes. One type of curing catalyst may be used singly, or two or more types of curing catalysts may be mixed and used.

As the curing accelerator, phenols are preferably used, and monofunctional phenols such as nonylphenol and paracumylphenol, bifunctional phenols such as bisphenol A, bisphenol F, and bisphenol S, or polyfunctional phenols such as phenol novolacs and cresol novolacs, and the like can be used. One type of curing accelerator may be used singly, or two or more types of curing accelerators may be mixed and used.

A thermoplastic resin can also be blended into the resin composition used as the insulating material considering dielectric characteristics, impact resistance, film processability, and the like. The thermoplastic resin is not particularly limited, and examples thereof can include fluororesins, polyphenylene ethers, modified polyphenylene ethers, polyphenylene sulfides, polycarbonates, polyetherimides, polyetheretherketones, polyacrylates, polyamides, polyamide-imides, and polybutadienes. One type of thermoplastic resin may be used singly, or two or more types of thermoplastic resins may be mixed and used.

Among thermoplastic resins, it is useful to blend a polyphenylene ether and a modified polyphenylene ether for use from the viewpoint of being able to improve the dielectric characteristics of the cured product. Examples of the polyphenylene ether and the modified polyphenylene ether include poly(2,6-dimethyl-1,4-phenylene) ether, alloyed polymers of poly(2,6-dimethyl-1,4-phenylene) ether and polystyrene, alloyed polymers of poly(2,6-dimethyl-1,4-phenylene) ether and styrene-butadiene copolymers, alloyed polymers of poly(2,6-dimethyl-1,4-phenylene) ether and styrene-maleic anhydride copolymers, alloyed polymers of poly(3,6-dimethyl-1,4-phenylene) ether and polyamides, and alloyed polymers of poly(2,6-dimethyl-1,4-phenylene) ether and styrene-butadiene-acrylonitrile copolymers. In order to provide reactivity and polymerizability to the polyphenylene ether, a functional group such as an amine group, an epoxy group, a carboxylic group, or a styryl group may be introduced at a polymer chain end, and a functional group such as an amine group, an epoxy group, a carboxyl group, a styryl group, or a methacryl group may be introduced into a side chain of a polymer chain.

Among thermoplastic resins, polyamide-imide resins are useful from the viewpoint of excellent moisture resistance and further a good adhesiveness to metals. The raw materials of the polyamide-imide resin are not particularly limited. Examples of the acidic component include trimellitic anhydride and trimellitic anhydride monochloride. Examples of the amine component include meta-phenylenediamine, para-phenylenediamine, 4,4'-diaminodiphenyl ether, 4,4'-diaminodiphenylmethane, bis[4-(aminophenoxy)phenyl] sulfone, and 2,2'-bis[4-(4-aminophenoxy)phenyl]propane. The polyamide-imide resin may be siloxane-modified in order to improve drying properties, and in this case, a siloxane diamine can be used as the amino component. For the polyamide-imide resin, one having a molecular weight of 50000 or more is preferably used considering film processability.

The-described thermoplastic resins have been mainly described as the insulating material used in the prepreg, but these thermoplastic resins are not limited to use as the prepreg. For example, a film obtained by processing using the-described thermoplastic resin (film material) may be used as the first insulating resin layer in the supporting substrate for circuit formation.

An inorganic filler may be mixed into the resin composition used as the insulating material. The inorganic filler is not particularly limited, and examples thereof include alumina, aluminum hydroxide, magnesium hydroxide, clay, talc, antimony trioxide, antimony pentoxide, zinc oxide, fused silica, glass powder, quartz powder, and shirasu balloons. One type of these inorganic fillers may be used singly, or two or more types of these inorganic fillers may be mixed and used.

The resin composition used as the insulating material may contain an organic solvent. The organic solvent is not particularly limited, and an aromatic hydrocarbon-based solvent such as benzene, toluene, xylene, or trimethylbenzene; a ketone-based solvent such as acetone, methyl ethyl ketone, or methyl isobutyl ketone; an ether-based solvent such as tetrahydrofuran; an alcohol-based solvent such as isopropanol or butanol; an ether-alcohol solvent such as 2-methoxyethanol or 2-butoxyethanol; an amide-based solvent such as N-methylpyrrolidone, N,N-dimethylformamide, or N,N-dimethylacetamide; or the like can be used in combination as desired. The amount of the solvent in the varnish when the prepreg is fabricated is preferably in the range of 40 to 80% by mass based on the entire resin composition. The viscosity of the varnish is desirably in the range of 20 to 100 cP (20 to 100 mPa·s).

The resin composition used as the insulating material may contain a flame retardant. The flame retardant is not particularly limited, and, for example, known conventional flame retardants such as bromine compounds such as decabromodiphenyl ether, tetrabromobisphenol A, tetrabromophthalic anhydride, and tribromophenol, phosphorus compounds such as triphenyl phosphate, trixylyl phosphate, and cresyl diphenyl phosphate, metal hydroxides such as magnesium hydroxide and aluminum hydroxide, red phosphorus and modified products thereof, antimony compounds such as antimony trioxide and antimony pentoxide, and triazine compounds such as melamine, cyanuric acid, and melamine cyanurate can be used.

A variety of additives and fillers such as the-described curing agent and curing accelerator, and in addition, thermoplastic particles, a colorant, an ultraviolet-opaque agent, an antioxidant, and a reducing agent can be further added, as needed, to the resin composition used as the insulating material.

In this embodiment, the prepreg can be obtained as a prepreg in a semi-cured state (B-stage state), for example, by impregnating or coating the base material described above with the resin composition (including a varnish) so that the amount of the resin composition adhering to the base material is 20 to 90% by mass in terms of resin content in the prepreg after drying, and then performing heating and drying at a temperature of 100 to 200° C. for 1 to 30 minutes. As such a prepreg, for example, GHPL-830NS (product name) manufactured by MITSUBISHI GAS CHEMICAL COMPANY, INC. can be used. In the substrate forming step (a) in this embodiment, for example, heating and pressurization can be performed in a configuration in which 1 to 20 of these prepregs are stacked so as to provide the desired thickness of the insulating resin layer, and, for example, copper foil such as release layer-attached copper foil is disposed on both surfaces of the stack so as to be in contact. As the molding method, a usual method for a copper clad laminate can be applied, and, for example, molding can usually be performed at a temperature in the range of 100 to 250° C. and a pressure in the range of 2 to 100 kg/cm² for a heating time in the range of 0.1 to 5 hours using a multistage press, a multistage vacuum press, continuous molding machine, an autoclave molding machine, or the like, and molding can be performed under the lamination conditions of 50 to 200° C. and 0.1 to 10 MPa under the condition of a vacuum or atmospheric pressure using a vacuum lamination apparatus or the like. As the first insulating resin layer, in addition to the, metal foil clad laminates commercially available as a Copper clad laminate (CCL) and the like, and the CCL from which the copper foil is removed can be used.

The thickness of the first insulating resin layer is appropriately set as desired and therefore is not particularly limited and can be 0.02 mm to 2.0 mm and is preferably 0.03 mm to 0.2 mm, further preferably 0.04 mm to 0.15 mm.

(Release Layer)

The supporting substrate for circuit formation in this embodiment comprises the release layer comprising at least the silicon compound, and the ultrathin copper foil having a thickness of 1 μm to 5 μm.

The "release layer" means a layer which comprises at least a silicon compound and is located between the first insulating resin layer and the ultrathin copper foil and in which at least the peel strength (x) between the first insulating resin layer and the release layer has the relationship x<y with the peel strength (y) between the ultrathin copper foil and the first wiring conductor. The release layer can comprise a resin composition as needed, in addition to the silicon compound. As the resin composition, for example, the-described thermosetting resin can be used. Although not particularly limited, the peel strength (Z) between the release layer and the ultrathin copper foil preferably has the relationship x<z in relationship with the peel strength (x).

The silicon compound is not particularly limited, and, for example, a silane compound represented by the following formula (1) and hydrolysis products or condensates of hydrolysis products thereof (these are hereinafter sometimes collectively simply referred to as "silane compounds") can be used. The release layer can be formed, for example, by providing on copper foil or ultrathin copper foil a single silane compound or a silicon compound obtained by combining a plurality of silane compounds. The means for providing the silicon compound is not particularly limited, and, for example, known means such as application can be used.

formula (1)

wherein $R^1$ is an alkoxy group or a halogen atom, $R^2$ is a hydrocarbon group selected from the group consisting of an alkyl group, a cycloalkyl group, and an aryl group (the hydrocarbon group may have one or more hydrogen atoms replaced by a halogen atom), $R^3$ and $R^4$ are each independently a halogen atom, an alkoxy group, or a hydrocarbon group selected from the group consisting of an alkyl group, a cycloalkyl group, and an aryl group (the hydrocarbon group may have one or more hydrogen atoms replaced by a halogen atom).

The silane compound represented by the formula (1) preferably has at least one alkoxy group from the viewpoint of preventing too much a decrease in close adhesiveness to the ultrathin copper foil. From a similar viewpoint, the silane compound represented by the formula (1) preferably has at least one hydrocarbon group selected from the group consisting of an alkyl group, a cycloalkyl group, and an aryl group.

From the viewpoint of adjusting peel strength, particularly the peel strength (x), the silane compound represented by the formula (1) preferably has three alkoxy groups and one hydrocarbon group. For example, one in which in formula (1), both $R^3$ and $R^4$ are alkoxy groups is preferred.

The alkoxy group is not particularly limited, and examples thereof include linear, branched, or cyclic alkoxy groups having 1 to 20 carbon atoms (preferably 1 to 10 carbon atoms, more preferably 1 to 5 carbon atoms). Examples of the alkoxy group include a methoxy group, an ethoxy group, a n- or iso-propoxy group, a n-, iso-, or tert-butoxy group, a n-, iso-, or neo-pentoxy group, a n-hexoxy group, a cyclohexoxy group, a n-heptoxy group, or a n-octoxy group.

Examples of the halogen atom include a fluorine atom, a chlorine atom, a bromine atom, and an iodine atom.

The alkyl group is not particularly limited, and examples thereof include linear or branched alkyl groups having 1 to 20 carbon atoms (preferably 1 to 10 carbon atoms, more preferably 1 to 5 carbon atoms). Examples of the alkyl group include a methyl group, an ethyl group, a n- or iso-propyl group, a n-, iso-, or tert-butyl group, a n-, iso-, or neo-pentyl group, a n-hexyl group, a n-octyl group, and a n-decyl group.

Examples of the cycloalkyl group include cycloalkyl groups having 3 to 10 carbon atoms (preferably 5 to 7) carbon atoms. Examples of the cycloalkyl group include a cyclopropyl group, a cyclobutyl group, a cyclopentyl group, a cyclohexyl group, a cycloheptyl group, and a cyclooctyl group.

The aryl group is not particularly limited, and examples thereof include aryl groups having 6 to 20 (preferably 6 to 14) carbon atoms. Examples of the aryl group include a phenyl group, phenyl groups substituted by alkyl groups (examples: a tolyl group and a xylyl group), a 1- or 2-naphthyl group, and an anthryl group.

The hydrocarbon group may have one or more hydrogen atoms replaced by a halogen atom and can have one or more hydrogen atoms replaced, for example, by a fluorine atom, a chlorine atom, or a bromine atom.

As the examples of the silane compounds described above, compounds other than silicone compounds are preferred. Examples thereof include methyltrimethoxysilane, dimethyldimethoxysilane, ethyltrimethoxysilane, n- or iso-propyltrimethoxysilane, n-, iso-, or tert-butyltrimethoxysilane, n-, iso-, or neo-pentyltrimethoxysilane, hexyltrimethoxysilane, octyltrimethoxysilane, decyltrimethoxysilane, phenyltrimethoxysilane; alkyl-substituted phenyltrimethoxysilane (for example, p-(methyl)phenyltrimethoxysilane), methyltriethoxysilane, ethyltriethoxysilane, n- or iso-propyltriethoxysilane, n-, iso-, or tert-butyltriethoxysilane, pentyltriethoxysilane, hexyltriethoxysilane, octyltriethoxysilane, decyltriethoxysilane, phenyltriethoxysilane, alkyl-substituted phenyltriethoxysilane (for example, p-(methyl)phenyltriethoxysilane), (3,3,3-trifluoropropyl)trimethoxysilane, and tridecafluorooctyltriethoxysilane, methyltrichlorosilane, dimethyldichlorosilane, trimethylchlorosilane, phenyltrichlorosilane, trimethylfluorosilane, dimethyldibromosilane, diphenyldibromosilane, hydrolysis products thereof, and condensates of hydrolysis products thereof. Among these, from the viewpoint of easy availability, dimethyldimethoxysilane, n-propyltrimethoxysilane, phenyltrimethoxysilane, hexyltrimethoxysilane, methyltriethoxysilane, dimethyldiethoxysilane, trifluoropropyltrimethoxysilane, and dimethyldichlorosilane are preferred, and dimethyldimethoxysilane, n-propyltrimethoxysilane, methyltriethoxysilane, dimethyldiethoxysilane, trifluoropropyltrimethoxysilane, and dimethyldichlorosilane are particularly preferred.

For the release layer formed on copper foil or ultrathin copper foil using such a silane compound as the silicon compound, a commercial product may be used. As the commercial product, for example, a release layer comprising as a silicon compound at least one selected from the group consisting of dimethyldimethoxysilane, n-propyltrimethoxysilane, phenyltrimethoxysilane, and hexyltrimethoxysilane formed on copper foil can be used. Examples thereof include "PCS" (trade name) manufactured by JX Nippon Mining & Metals Corporation.

The peel strength (x) between the release layer and the first insulating resin layer is not particularly limited but is preferably 3 to 20 N·m, further preferably 5 to 15 N·m, and particularly preferably 8 to 12 N·m from the viewpoint of physically peeling the first insulating resin layer in the peeling step (e) while preventing the first insulating resin layer from peeling in a step before the peeling step (e) in the manufacturing method in this embodiment. For example, when the peel strength (x) is in the-described range, peeling does not occur during conveyance and during processing, and on the other hand, the first insulating resin layer can be easily physically peeled by hand or the like in the peeling step (e).

Although not particularly limited, the difference between the peel strength (y) and the peel strength (x) (y–x) is, for example, preferably 50 N·m or more, further preferably 100 N·m or more, and particularly preferably 200 N·m or more from the viewpoint of preventing peeling to the ultrathin copper foil during the peeling of the first insulating resin layer in the peeling step (e).

The peel strength (x) and/or the peel strength (y) can be adjusted in the-described ranges, for example, by adjusting the type of the silicon compound and the amount of the silicon compound applied, in the release layer for the peel strength (x), and adjusting pressing conditions, plating thickness, materials, and conditions in roughening treatment for the peel strength (y).

The layer thickness of the release layer is not particularly limited but is preferably 5 nm to 100 nm, further preferably 10 nm to 80 nm, and particularly preferably 20 nm to 60 nm from the viewpoint of effectively preventing the infiltration of a chemical solution by the anchor effect between the ultrathin copper foil and the first insulating resin layer. As shown in FIG. 1A and the like, in the supporting substrate for circuit formation in this embodiment, the release layer is preferably directly laminated on the first insulating resin layer so that the surface of the first insulating resin layer and the surface of the release layer are in direct contact with each other.

<Ultrathin Copper Foil>

The ultrathin copper foil has a thickness of 1 μm to 5 μm, preferably 2 μm to 4 μm, and further preferably 2.5 μm to 3.5 μm. The ultrathin copper foil is preferably one in which the 10-point average roughness (Rzjis) shown in JISB0601: 2001 is 0.3 μm to 3.0 μm, further preferably 0.5 μm to 2.0 μm, and particularly preferably 0.7 μm to 1.5 μm on both surfaces from the viewpoint of effectively preventing the infiltration of a chemical solution by the anchor effect between the ultrathin copper foil and the first insulating resin layer.

The ultrathin copper foil can be subjected to roughening treatment on which a knobby electrodeposit layer (commonly referred to as "burnt plating") is formed, or oxidation treatment, reduction treatment, or etching is performed. The ultrathin copper foil manufacturing conditions are not particularly limited. In the case of a copper sulfate bath, the conditions of 50 to 100 g/L of sulfuric acid, 30 to 100 g/L of copper, a liquid temperature of 20 to 80° C., and a current density of 0.5 to 100 A/dm$^2$ are generally often used, and in the case of a copper pyrophosphate bath, the conditions of 100 to 700 g/L of potassium pyrophosphate, 10 to 50 g/L of copper, a liquid temperature of 30 to 60° C., a pH of 8 to 12, and a current density of 0.5 to 10 A/dm$^2$ are generally often used. A variety of additives may also be added considering the physical properties of copper and smoothness.

The ultrathin copper foil can be formed, for example, using a peelable type or using copper foil having a fixed thickness. The "peelable type" ultrathin copper foil refers to ultrathin copper foil having a carrier, the carrier being, for example, copper foil capable of being peeled. When the peelable type is used, it is used by peeling the carrier from the ultrathin copper foil in the substrate forming step (a).

A case where in the substrate forming step (a), the ultrathin copper foil is formed using copper foil having a fixed thickness will be described. When the ultrathin copper foil is formed using copper foil having a fixed thickness, first, the release layer is formed on the copper foil having the fixed thickness to provide release layer-attached copper foil. The means for forming the release layer on the copper foil is not particularly limited, and, for example, the release layer can be formed by providing a silicon compound on the copper foil by a known method such as application. As the release layer-attached copper foil, a commercial product can also be used, and, for example, "PCS" (trade name) manufactured by JX Nippon Mining & Metals Corporation described above can be used as the release layer-attached copper foil. The thickness of the copper foil having the fixed thickness (that is, the copper foil portion of the release layer-attached copper foil) is not particularly limited but is preferably 1 μm or more, further preferably 1 μm to 20 μm, from the viewpoint of removing an unnecessary portion to the desired thickness (1 μm to 5 μm) by thickness decreasing means such as etching as needed. However, when the thickness of the copper foil having the fixed thickness is 1 μm to 5 μm, the treatment by the thickness decreasing means may be unnecessary. As the thickness decreasing means, a known method can be appropriately applied. Examples thereof include etching treatment. The etching treatment can be performed, for example, by etching using a hydrogen peroxide-sulfuric acid-based soft etchant.

When the ultrathin copper foil is formed using the copper foil having the fixed thickness as described above, for example, release layer-attached copper foil in which the release layer is formed on copper foil having a thickness of 1 μm to 20 μm can be used. Specifically, the ultrathin copper foil can be formed from the copper foil having the fixed thickness in the substrate forming step (a) through the step (a-1) of disposing release layer-attached copper foil in which the release layer is formed on copper foil having a thickness of 1 μm to 20 μm on the first insulating resin layer so that the release layer and the first insulating resin layer are in contact with each other, and then subjecting the copper foil portion of the release layer-attached copper foil to etching treatment to form the ultrathin copper foil, in the substrate forming step (a). The manufacturing method in this embodiment is not limited to this embodiment. For example, when 12 μm copper foil is used, the supporting substrate for circuit formation can be fabricated by forming the release layer by application or the like, performing lamination and pressing with the first insulating resin layer, and then performing the soft etching of the copper foil to adjust the thickness of the copper foil to, for example, 3 μm to form ultrathin copper foil. The etching treatment is not particularly limited and can be performed after the release layer-attached copper foil is heated and pressurized on the first insulating resin layer.

Antirust treatment can be performed (an antirust-treated layer can be formed) on the adhesion surface of the ultrathin copper foil to the release layer. The antirust treatment can be performed using any of nickel, tin, zinc, chromium, molybdenum, and cobalt, or an alloy thereof. With these, a thin film is formed on the copper foil by sputtering, electroplating, or electroless plating, and in terms of cost, electroplating is preferred. Specifically, plating is performed using as a plating layer a plating layer comprising one or more types of metal salts selected from the group consisting of nickel, tin, zinc, chromium, molybdenum, and cobalt. In order to make the deposition of metal ions easy, the necessary amount of a complexing agent such as a citrate, a tartrate, or sulfamic acid may be added. The plating solution is usually used in the acidic region, and the plating is performed at room temperature to a temperature of 80° C. For the plating, current density and time are usually appropriately selected from the ranges of a current density of 0.1 to 10 A/dm$^2$ and a time of 1 to 60 seconds, preferably 1 to 30 seconds. The amount of the antirust treatment metal differs depending on the type of the metal and is preferably 10 to 2000 μg/dm$^2$ in total. The thickness of the antirust-treated layer being too large causes etching inhibition and a decrease in electrical characteristics. The thickness of the antirust-treated layer being too small can be a factor of a decrease in peel strength with the resin.

Further, when a chromate-treated layer is formed on the antirust-treated layer, a decrease in adhesion strength to the release layer can be suppressed, which is useful. Specifically, chromate treatment is performed using an aqueous solution comprising hexavalent chromium ions. The chromate treatment is also possible by simple immersion treatment but is preferably performed by cathodic treatment. It is recommended that the chromate treatment is performed under the conditions of 0.1 to 50 g/L of sodium dichromate, a pH of 1 to 13, a bath temperature of 0 to 60° C., a current density of 0.1 to 5 A/dm$^2$, and a current time of 0.1 to 100 seconds. The chromate treatment can also be performed using potassium chromate or potassium dichromate instead of sodium dichromate.

In this embodiment, a coupling agent is preferably further adsorbed on the antirust-treated layer. The silane coupling agent is not particularly limited, and, for example, epoxy-functional silanes such as 3-glycidoxypropyltrimethoxysilane and 2-(3,4-epoxycyclohexyl)ethyltrimethoxysilane, amine-functional silanes such as 3-aminopropyltrimethoxysilane, N-2-(aminoethyl)3-aminopropyltrimethoxysilane, and N-2-(aminoethyl)3-aminopropylmethyldimethoxysilane, olefin-functional silanes such as vinyltrimethoxysilane, vinylphenyltrimethoxysilane, and vinyltris(2-methoxyethoxy)silane, acrylic-functional silanes such as 3-acryloxypropyltrimethoxysilane, methacrylic-functional silanes such as 3-methacryloxypropyltrimethoxysilane, and mercapto-functional silanes such as 3-mercaptopropyltrimethoxysilane are used. These may be used singly, or a plurality of these may be mixed and used. These coupling agents are adsorbed by dissolving them in a solvent such as water at a concentration of 0.1 to 15 G/L and applying the solution to the metal foil at room temperature to a temperature of 50° C., or by electrodeposition. These silane coupling agents form a film by condensation bonding to the hydroxyl group of the antirust metal on the copper foil surface. After the silane coupling treatment, stable bonds are formed by heating, ultraviolet irradiation, or the like. In the case of heating, drying is performed at a temperature of 80 to 200° C. for 2 to 60 seconds. Ultraviolet irradiation is performed in the ranges of 200 to 400 nm and 200 to 2500 mJ/dm$^2$.

[First Wiring Conductor Forming Step (b)]

The first wiring conductor forming step (b) is the step of forming a first wiring conductor on the ultrathin copper foil of the supporting substrate for circuit formation described above by pattern copper electroplating. Through the first wiring conductor forming step (b), a first wiring conductor 6 is formed on the ultrathin copper foil 4 of the supporting substrate for circuit formation 1 as shown in FIG. 1C. The means for forming the first wiring conductor is not particularly limited, and, for example, the first wiring conductor can be formed by the following steps.

As the first wiring conductor forming step (b), for example, by laminating a plating resist on the ultrathin copper foil (step (b-1)), forming a wiring circuit pattern in the plating resist by photolithography (step (b-2)), forming a first wiring conductor by pattern copper electroplating on the ultrathin copper foil on which the wiring circuit pattern is formed in the plating resist (step (b-3)), and removing the plating resist (step (b-4)), the first wiring conductor can be formed on the ultrathin copper foil. In the step (b-2) among the steps, the plating resist laminated on the ultrathin copper foil can be subjected to exposure and development by photolithography to form the wiring circuit pattern in the plating resist. Then, by the step (b-3), the ultrathin copper foil on which the wiring circuit pattern is formed in the plating resist can be subjected to pattern copper electroplating treatment to form the first wiring conductor with plating copper. After the first wiring conductor is formed, the plating resist is removed in the step (b-4).

The-described plating resist is not particularly limited, and, for example, a known one such as a commercial dry film resist can be appropriately selected and used. In addition, the photolithography (including exposure, development, and the removal of the resist) when the wiring circuit pattern is formed in the plating resist is not particularly limited and can be carried out using known means and a known apparatus. Further, the pattern copper electroplating for forming the first wiring conductor is not particularly limited either, and a known method can be appropriately used.

The pattern width of the first wiring conductor is not particularly limited, and the width can be appropriately selected according to the application and can be, for example, 5 to 100 µm, preferably 10 to 30 µm.

[Lamination Step (c)]

The lamination step (c) is the step of disposing a second insulating resin layer so as to be in contact with the first wiring conductor, and heating and pressurizing the second insulating resin layer for lamination. The lamination step (c) may be the step of further disposing a metal layer on the second insulating resin layer and performing heating and pressurization to laminate the second insulating resin layer and the metal layer. Through the lamination step (c), a second insulating resin layer 7 and a metal layer 8 can be laminated so as to be in contact with the first wiring conductor 6, as shown in FIG. 1D. In FIG. 1D, an embodiment in which the metal layer is provided is shown, but this embodiment is not limited to the embodiment.

As the second insulating resin layer, a material similar to that of the-described first insulating resin layer (for example, a prepreg) can be used. The thickness of the second insulating resin layer is appropriately set as desired and therefore is not particularly limited and can be, for example, 0.02 mm to 2.0 mm and is preferably 0.03 mm to 0.2 mm, further preferably 0.04 mm to 0.15 mm.

As the metal layer, for example, ultrathin copper foil similar to the-described ultrathin copper foil can be used. As the ultrathin copper foil, for example, carrier-attached ultrathin copper foil can be used. In this case, the carrier is peeled after the ultrathin copper foil is disposed so as to be in contact with the second insulating resin layer, and laminated by heating and pressurization.

The conditions of the heating and pressurization of the second insulating resin layer and metal layer are not particularly limited, and, for example, by carrying out vacuum pressing under the conditions of a temperature of 220±2° C., a pressure of 25±0.2 MPa, and a holding time of 60 minutes, the second insulating resin layer and the metal layer can be laminated.

The lamination step (c) is not particularly limited, and, for example, the second insulating resin layer and the metal layer can be laminated by the following steps. As the lamination step (c), for example, it is possible to subject the surface of the first wiring conductor to roughening treatment for obtaining close adhesion to the second insulating resin layer (step (c-1)), and dispose the second insulating resin layer so as to be in contact with the first wiring conductor subjected to the roughening treatment, further dispose a metal layer on the second insulating resin layer, and perform heating and pressurization to laminate the second insulating resin layer and the metal layer (step (c-2)). The roughening treatment is not particularly limited, and known means can be appropriately used. Examples thereof include means using a copper surface roughening liquid.

[Second Wiring Conductor Forming Step (d)]

The second wiring conductor forming step (d) is the step of forming in the second insulating resin layer a non-through hole reaching the first wiring conductor and connecting the inner wall of the non-through hole by copper electroplating and/or electroless copper plating to form a second wiring conductor. In the second wiring conductor forming step (d), copper electroplating and/or electroless copper plating are performed, and thus the first wiring conductor 6 and the metal layer 8 are electrically connected through plating copper 9 formed on the inner walls of the non-through holes as shown in FIG. 1E. Then, as shown in FIG. 1F, the metal layer 8 is patterned, and thus a second wiring conductor 10 can be formed on the second insulating resin layer 7.

The means for forming the non-through hole is not particularly limited, and, for example, known means such as a laser such as a carbonic acid gas laser, and a drill can be used. The non-through hole is formed in the second insulating resin layer via the metal layer, and provided in order to electrically connect the second wiring conductor formed in this step and the first wiring conductor. The number and size of non-through holes can be appropriately selected as desired. After the non-through hole is formed, desmear treatment can be performed using a sodium permanganate aqueous solution or the like.

In the second wiring conductor forming step (d), after the non-through hole is formed, copper electroplating and/or electroless copper plating are performed to form a copper plating film on the inner wall of the non-through hole to electrically connect the first wiring conductor and the second wiring conductor. The method for performing copper electroplating and/or electroless plating is not particularly limited, and a known method can be adopted. For the copper plating, only either one of copper electroplating or electroless plating may be performed, but both of copper electroplating and electroless plating are preferably performed.

In the second wiring conductor forming step (d), after the copper electroplating/electroless copper plating treatment, the second wiring conductor is formed. The method for forming the second wiring conductor is not particularly limited, and, for example, known means such as a subtractive method or a semi-additive method can be appropriately adopted.

The second wiring conductor forming step (d) is not particularly limited, and, for example, it is possible to form in the second insulating resin layer a non-through hole reaching the first wiring conductor (step (d-1)), connect the inner wall of the non-through hole by copper electroplating and/or electroless copper plating (step (d-2)), and form the second wiring conductor by a subtractive method or a semi-additive method (step (d-3)). In the step (d-3), although not particularly limited, for example, it is possible to carry out the surface conditioning of the metal layer, laminate a dry film resist or the like, further bond a negative mask, then print a circuit pattern by an exposure machine, and develop the dry film resist with a developing solution to form an etching resist. Then, etching treatment is performed, and the copper in portions without the etching resist is removed with a ferric chloride aqueous solution or the like, and then the resist is removed. Thus, the second wiring conductor can be formed.

In addition, as the interlayer connection method applicable in this embodiment, it is possible to apply a method of subjecting known laser-formed blind via portions to chemical copper plating for application (a method of forming wiring circuits by laser processing and then performing patterning and interlayer connection by chemical copper plating), a method of performing interlayer connection by sticking an insulating layer with metal bumps (preferably copper bumps) previously formed in portions to be connection portions by plating or by etching metal foil, or the like, and further a method of printing bumps in predetermined places by screen printing or the like with a metal paste containing a metal filler such as solder, silver, and copper in an insulating resin, then curing the paste by drying, and ensuring electrical conduction between inner and outer layers by heating and pressurization, and the like.

[Peeling Step (e)]

The peeling step (e) is the step of peeling the first insulating resin layer from the supporting substrate for circuit formation on which the first wiring conductor and the second wiring conductor are formed. Through the peeling step (e), the first insulating resin layer is peeled at the interface with the release layer 3, and a laminate A in which the first wiring conductor 6, the second insulating resin layer 7, and the second wiring conductor 10 are laminated on the release layer 3 and the ultrathin copper foil 4 is formed, as shown in FIG. 1G.

In the peeling step (e), the first insulating resin layer is preferably peeled at the interface between the first insulating resin layer and the release layer, but, for example, part of the release layer may be peeled together with the first insulating resin layer. An embodiment in which the first insulating resin layer is peeled together with the release layer at the interface between the release layer and the ultrathin copper foil is also included. For the means for peeling the first insulating resin layer, either physical means or chemical means can be adopted, but, for example, physical force is preferably applied to the release layer to physically peel the first insulating resin layer.

[Removal Step (f)]

The removal step (f) is the step of removing the release layer and/or the ultrathin copper foil. Through the removal step (f), a package substrate for mounting a semiconductor device 20 in which the first wiring conductor 6 (inner layer) is embedded in the second insulating resin layer 7, and the first wiring conductor (inner layer) and the second wiring conductor 10 (outer layer) are electrically joined can be formed as shown in FIG. 1H. In the removal step (f), for example, for the removal of the release layer and/or the ultrathin copper foil, they can be removed using a sulfuric acid-based or hydrogen peroxide-based etchant. For example, when the first insulating resin layer is peeled at the interface with the release layer, and when the release layer is broken and part of it is peeled together with the first insulating resin layer, in the peeling step (e), the entire release layer or part of it and the ultrathin copper foil are removed in the removal step (f). When the first insulating resin layer is peeled together with the release layer at the interface between the release layer and the ultrathin copper foil in the peeling step (e), only the ultrathin copper foil is removed in the removal step (f). The sulfuric acid-based or hydrogen peroxide-based etchant is not particularly limited, and one used in the industry can be used.

In FIG. 1 in which this embodiment is illustratively described, the package substrate for mounting a semiconductor device 20 is a package substrate for mounting a semiconductor device having a two-layer structure as in FIG. 2A. But, the present invention is not limited to this, and package substrates for semiconductor device mounting having buildup structures, a three-layer structure (FIG. 2B), a four-layer structure (FIG. 2C) . . . and an n-layer structure, as shown in FIG. 2B and FIG. 2C can be formed. For example, a package substrate for mounting a semiconductor device having a buildup structure can be manufactured by further repeatedly subjecting the supporting substrate for circuit formation on which the first wiring conductor and the second wiring conductor are formed to the lamination step (c) and the second wiring conductor forming step (d) in the second wiring conductor forming step (d), and carrying out the peeling of the first insulating resin layer, the removal of the release layer and the ultrathin copper foil, and the step of performing cutting processing to package size.

«Method for Manufacturing Semiconductor Device Mounting Substrate»

The method for manufacturing a semiconductor device mounting substrate in this embodiment comprises the substrate forming step (a) of forming a supporting substrate for circuit formation comprising a first insulating resin layer, a release layer comprising at least a silicon compound, and ultrathin copper foil having a thickness of 1 µm to 5 µm, in this order; the first wiring conductor forming step (b) of forming a first wiring conductor on the ultrathin copper foil of the supporting substrate for circuit formation by pattern copper electroplating; the lamination step (c) of disposing a second insulating resin layer so as to be in contact with the first wiring conductor, and heating and pressurizing the second insulating resin layer for lamination; the second wiring conductor forming step (d) of forming in the second insulating resin layer a non-through hole reaching the first wiring conductor and connecting the inner wall of the non-through hole by copper electroplating and/or electroless copper plating to form a second wiring conductor; the semiconductor device mounting step (g) of mounting a semiconductor device on the second wiring conductor; the peeling step (e) of peeling the first insulating resin layer from the supporting substrate for circuit formation on which the semiconductor device is mounted on the second wiring conductor; and the removal step (f) of removing the release layer and/or the ultrathin copper foil.

In the method for manufacturing a package substrate for mounting a semiconductor device in this embodiment, after the ultrathin copper foil is removed to form the package substrate for mounting a semiconductor device as described above, a semiconductor device, for example, a bare chip, can be mounted as desired. On the other hand, the package substrate for mounting a semiconductor device may have a relatively thin structure as desired. Therefore, from the viewpoint of improving handling properties, a semiconductor device such as a bare chip can be mounted in the process of manufacturing a package substrate for mounting a semiconductor device, to manufacture a semiconductor device mounting substrate, like an embodiment described later. But, in a case where the release layer in this embodiment is not provided, and, for example, carrier copper foil-attached ultrathin copper foil is used, when somewhat high temperature is applied to the substrate due to treatment such as reflow in mounting a semiconductor device, peeling occurs between the copper foil and the ultrathin copper foil, and, for example, a blistered state in a circle having a diameter of 15 to 30 mm (the so-called "blister") may occur. This blister may also occur in several places. The causes of the occurrence of this blister are not certain, but, for example, the fact that a material such as an aminocarboxylic acid (organic) used in general carrier copper foil-attached ultrathin copper foil decomposes and vaporizes due to heat (for example, 260° C.) during reflow is presumed to be a cause.

On the other hand, the release layer comprising the silicon compound is used in the method for manufacturing a semiconductor device mounting substrate in this embodiment as described above, and therefore the occurrence of such a blister that occurs between the copper foil and the ultrathin copper foil can be prevented even if heat is applied to the substrate during the reflow of a joining material such as solder. Also from such a viewpoint, the silicon compound is preferably a compound other than a silicone compound.

The method for manufacturing a semiconductor device mounting substrate in this embodiment will be described below, and for the steps and members and materials common to the method for manufacturing a semiconductor device mounting substrate in this embodiment and the method for manufacturing a package substrate for mounting a semiconductor device described above, similar conditions and members can be used, and the preferred ranges are also similar. Therefore, in the following description, for the parts common to the method for manufacturing a semiconductor device mounting substrate in this embodiment and the method for manufacturing a package substrate for mounting a semiconductor device described above, description will be omitted.

(Semiconductor Device Mounting Step (g))

The semiconductor device mounting step (g) is the step of mounting the semiconductor device on the second wiring conductor. In the method for manufacturing a semiconductor device mounting substrate in this embodiment, the steps from the substrate forming step (a) to the second wiring conductor forming step (d) in the method for manufacturing a package substrate for mounting a semiconductor device described above are sequentially performed, and the semiconductor device is mounted on the supporting substrate for circuit formation on which the first wiring conductor and the second wiring conductor are formed. At this time, for the supporting substrate for circuit formation, one in which the release layer, the ultrathin copper foil, the first wiring conductor, and the second wiring conductor are provided on only one side of the first insulating resin layer is preferably used. The surface of the first insulating resin layer on the side on which the semiconductor device is not mounted is not particularly limited, and a metal such as copper foil may be laminated, or the surface of the first insulating resin layer may be in an exposed state.

The semiconductor device is not particularly limited, and a desired device can be appropriately used, and, for example, a bare chip on which gold bumps are formed on aluminum electrode portions by a gold wire ball bonding method can be used.

In the semiconductor device mounting step (g), the semiconductor device can be mounted on the second wiring conductor via a joining material. The joining material is not particularly limited as long as it has electrically conductive means. For example, solder (for example, solder balls and a solder paste) can be used. The semiconductor device can be mounted via the joining material after the second wiring conductor is subjected to surface treatment. The surface treatment is not particularly limited, and examples thereof include the formation of a nickel layer and a gold plating layer. In a case where solder is used as the joining material, and the like, after the semiconductor device is mounted on the second wiring conductor, treatment such as reflow can be performed. At this time, the temperature of reflow is appropriately selected depending on the melting point of the joining material, and the like, and can be, for example, 260° C. or more.

Next, the method for manufacturing a semiconductor device mounting substrate in this embodiment will be described using FIG. 1 and FIG. 6. First, as shown in FIG. 1A to FIG. 1F, according to the method for manufacturing a package substrate for mounting a semiconductor device described above, the substrate forming step (a) to the second wiring conductor forming step (d) are sequentially performed to fabricate a supporting substrate for circuit formation in which a release layer 3, ultrathin copper foil 4, a first wiring conductor 6, and a second wiring conductor 10 are provided on only one side of a first insulating resin layer. Then, a solder resist layer 13 having openings A is formed on the second wiring conductor 10 (see FIG. 6A). Then, a nickel layer 14 and a gold plating layer 15 are laminated and formed in the openings A (see FIG. 6B). Further, solder balls are mounted on the gold plating layer 15, and reflow is performed at about 260° C. to fabricate a multilayer printed wiring board on which solder balls 16 are formed (see FIG. 6C).

Then, the obtained multilayer printed wiring board and a bare chip 17 on which gold bumps are formed on aluminum electrode portions by a gold wire ball bonding method are aligned, the bare chip 17 is mounted on the multilayer printed wiring board, and further the multilayer printed wiring board on which the bare chip 17 is mounted is reflowed for connection with the solder. Then, washing is performed as desired, and resin sealing can be performed with a mold resin 18 (see FIG. 6D). As the mold resin 18, a known resin used in sealing material applications can be appropriately selected and used. Then, the first insulating resin layer 2 (prepreg layer) is peeled by physical force in a step similar to the-described peeling step (e) (see FIG. 6E).

Similarly, the ultrathin copper foil 4 and the release layer 3 are removed in the same manner as the-described removal step (f) using a hydrogen peroxide-sulfuric acid-based soft etchant or the like, and thus a semiconductor device mounting substrate 30 can be obtained (see FIG. 6F).

According to the method for manufacturing a semiconductor device mounting substrate in this embodiment, the productivity is excellent: the release layer is used, and therefore the occurrence of a blister due to the occurrence of such peeling that occurs between copper foil and ultrathin copper foil during reflow can be suppressed; the alignment of the bare chip 17, and the like can also be performed well; and the like.

EXAMPLES

The manufacturing methods of the present invention will be specifically described below by Examples.

Example 1

<Substrate Forming Step (a)>

Release layer-attached copper foil (trade name: PCS, manufactured by JX Nippon Mining & Metals Corporation) in which a release layer (the release layer 3 in FIG. 1A; thickness: 40 nm) composed of a silane compound was formed on 12 μm thick copper foil by application was disposed on both surfaces of a prepreg (the first insulating resin layer 2 in FIG. 1A; thickness 0.100 mm: GHPL-830NS ST56 manufactured by MITSUBISHI GAS CHEMICAL COMPANY, INC.) obtained by impregnating glass cloth (glass fibers) with a bismaleimide triazine resin (BT resin) and brought into the B stage, so that the release layer surface was in contact with the first insulating resin layer, and vacuum pressing was carried out under the conditions of a temperature of 220±2° C., a pressure of 5±0.2 MPa, and a holding time of 60 minutes. Then, the thickness of the copper foil was adjusted to 3 μm by etching using a hydrogen peroxide-sulfuric acid-based soft etchant, to fabricate a supporting substrate for circuit formation (the supporting substrate for circuit formation 1 in FIG. 1A) in which the release layers and ultrathin copper foil (the ultrathin copper foil 4 in FIG. 1A) were provided in this order on both surfaces of the first insulating resin layer.

<First Wiring Conductor Forming Step (b)>

A guide hole was formed in the supporting substrate for circuit formation using a router processing machine manufactured by Hitachi Via Mechanics, Ltd., and then the surfaces were etched by 1 to 2 µm using a hydrogen peroxide-sulfuric acid-based soft etchant. Then, "dry film resist NIT225" (trade name, manufactured by Nichigo-Morton Co., Ltd.) was laminated under the conditions of a temperature of 110±10° C. and a pressure of 0.50±0.02 MPa. The printing of circuit patterns on the dry film resists was carried out by a parallel exposure machine based on the guide hole, and then the dry film resists were developed using a 1% sodium carbonate aqueous solution, to form plating resist patterns. Then, pattern copper electroplating (copper electroplating) of about 15 to 20 µm was provided in a copper sulfate plating line at a copper sulfate concentration of 60 to 80 g/L and a sulfuric acid concentration of 150 to 200 g/L to form first wiring conductors (the first wiring conductors 6 in FIG. 1C). Then, the dry film resists were peeled and removed using an amine-based resist peeling liquid.

<Lamination Step (c)>

In order to obtain close adhesion to an insulating resin, the first wiring conductor (copper pattern) surfaces were subjected to roughening treatment using a copper surface roughening liquid CZ-8100 (product name, manufactured by MEC COMPANY LTD.). Then, prepregs (the second insulating resin layers 7 in FIG. 1D; thickness 0.100 mm: product name "GHPL-830NS ST56", manufactured by MITSUBISHI GAS CHEMICAL COMPANY, INC.) obtained by impregnating glass cloth (glass fibers) with a bismaleimide triazine resin (BT resin) and brought into the B stage were disposed on both surfaces of the supporting substrate for circuit formation on which the first wiring conductors were formed. Then, 18 µm thick carrier copper foil-attached ultrathin copper foil (ultrathin copper foil (metal layer); thickness 2 µm: product name "MTEx", manufactured by MITSUI MINING & SMELTING CO., LTD.) was disposed on the second insulating resin layers so that the carrier copper foil side was in contact with the second insulating resin layers, and vacuum pressing was performed under the conditions of a pressure of 2.5±0.2 MPa, a temperature of 220±2° C., and a holding time of 60 minutes. Then, 18 µm thick carrier copper foil was peeled to obtain the supporting substrate for circuit formation on which the second insulating resin layers and the 2 µm thick ultrathin copper foil (the metal layers 8 in FIG. 1D) were laminated on the first wiring conductors.

<Second Wiring Conductor Forming Step (d)>

Holes were processed one by one on both surfaces of the supporting substrate for circuit formation on which the second insulating resin layers and the metal layers were laminated on the first wiring conductors, under the conditions of a beam irradiation diameter Φ of 0.21 mm, a frequency of 500 Hz, a pulse width of 10 µs, and the number of irradiations of 7 shots using a carbonic acid gas laser processing machine LC-1C/21 (trade name, manufactured by Hitachi Via Mechanics, Ltd.), to form non-through holes reaching the first wiring conductors, in the second insulating resin layers via the metal layers.

Then, the supporting substrate for circuit formation on which the non-through holes were formed was subjected to desmear treatment using a sodium permanganate aqueous solution having a temperature of 80±5° C. and a concentration of 55±10 g/L, and further, plating having a thickness of 0.4 to 0.8 µm was carried out by electroless copper plating, and then plating having a thickness of 15 to 20 µm was carried out by copper electroplating. Thus, the inner walls of the non-through holes were connected by the plating, and the first wiring conductors (inner layers) and the metal layers (outer layers) were electrically connected by the plating (the plating copper 9 in FIG. 1E) on the inner walls of the non-through holes.

Next, the surface conditioning of the substrate surfaces (metal layers) was carried out, and dry film resists NIT225 (trade name, manufactured by Nichigo-Morton Co., Ltd.) were laminated under the conditions of a temperature of 110±10° C. and a pressure of 0.50±0.02 MPa. Then, negative masks were bonded, then circuit patterns were printed using a parallel exposure machine, and then the dry film resists were developed using a 1% sodium carbonate aqueous solution, to form etching resists. Then, the copper in portions without the etching resists was removed with a ferric chloride aqueous solution, and then the dry film resists were removed using a sodium hydroxide aqueous solution to form second wiring conductors (the second wiring conductors 10 in FIG. 1F).

<Peeling Step (e)>

After the second wiring conductors were formed, physical force was applied to the boundary portions between the release layer-attached copper foil and the first insulating resin layer (prepreg layer) to peel the first insulating resin layer (prepreg layer) from the supporting substrate for circuit formation on which the first wiring conductors and the second wiring conductors were formed, to provide a set of laminates (the laminates A in FIG. 1G).

<Removal Step (f)>

After the first insulating resin layer (prepreg layer) was peeled in the peeling step (e), the ultrathin copper foil and the release layer were removed using a hydrogen peroxide-sulfuric acid-based soft etchant. Then, a solder resist was formed, gold plating finishing was performed, and cutting processing to package size was performed to obtain a package substrate for mounting a semiconductor device (the package substrate for mounting a semiconductor device 20 in FIG. 1H).

(Confirmation of Chemical Solution Infiltration)

The laminate (the laminate A in FIG. 1G) in which the first insulating resin layer was peeled in the peeling step (e) in Example 1 was observed from the release layer 3 side. FIG. 3 is a photograph in which the laminate A in Example 1 is observed from the release layer side. As shown in FIG. 3, in Example 1, the infiltration of a chemical solution could not be confirmed on the release layer surface.

Comparative Example 1

The steps were carried out as in Example 1 except that copper foil having no release layer (thickness: 12 µm, trade name: JDLC, manufactured by JX Nippon Mining & Metals Corporation) was used instead of the release layer-attached copper foil (PCS) in the substrate forming step (a) of Example 1. But, in Comparative Example 1, when the first insulating resin layer was peeled in the peeling step (e), the copper foil was also peeled, and a missing portion was formed at the bottom of the obtained package substrate for mounting a semiconductor device.

Comparative Example 2

The package substrate for mounting a semiconductor device in Comparative Example 2 was fabricated as in Example 1 except that a supporting substrate for circuit formation 12 shown in FIG. 4A was used in the substrate forming step (a) of Example 1. The supporting substrate for circuit formation 12 is in a form in which as shown in FIG. 4A, a release layer is not provided on carrier copper-attached ultrathin copper foil (thickness 3 μm: product name "MTEx", manufactured by MITSUI MINING & SMELTING CO., LTD.), and carrier copper 11 is not peeled and the carrier copper 11 is disposed so as to be in contact with a first insulating resin layer 2. In other words, in the supporting substrate for circuit formation 12 in Comparative Example 2, the carrier copper 11 and ultrathin copper foil 4 are laminated from the first insulating resin layer 2 sides. In Comparative Example 2, in the peeling step (e), the carrier copper 11 and the first insulating resin layer 2 (prepreg layer) were peeled at the interfaces between the carrier copper 11 and the ultrathin copper foil 4 as shown in FIG. 4B.

(Confirmation of Chemical Solution Infiltration)

In Comparative Example 2, after the peeling step (e), the laminate in which the carrier copper 11 and the first insulating resin layer 2 (prepreg layer) were peeled was observed from the ultrathin copper foil 4 side. FIG. 5 is a photograph in which the laminate in Comparative Example 2 is observed from the ultrathin copper foil side. As shown in FIG. 5, it was confirmed that in Comparative Example 2, the chemical solution during the desmear treatment infiltrated into the ultrathin copper foil surface.

From the comparison of the results of Example 1 and Comparative Example 2, when a detachable core (supporting substrate for circuit formation) in which carrier copper-attached ultrathin copper foil was used as it was used, the infiltration of the chemical solution was confirmed, but when a detachable core (supporting substrate for circuit formation) in which release layers were used instead of carrier copper was used, the infiltration of the chemical solution was effectively suppressed. Thus, it was found that the supporting substrate for circuit formation used in the manufacturing method of the present invention was a substrate excellent in chemical resistance, and in the manufacturing method of the present invention, the improvement of the yield was expected, and the production efficiency was excellent. In addition, according to the manufacturing method of the present invention, it is not necessary to cover the side surfaces of the detachable core with the second insulating resin layers in order to prevent the infiltration of the chemical solution, and therefore a relatively large detachable core can be used. Therefore, the manufacturing method of the present invention can enhance the flexibility of the design of the package substrate for mounting a semiconductor device.

Example 2

(Fabrication of Semiconductor Device Mounting Substrate)

The substrate forming step (a) to the second wiring conductor forming step (d) in Example 1 were sequentially performed to fabricate a supporting substrate for circuit formation in which a release layer, ultrathin copper foil, a first wiring conductor, and a second wiring conductor were provided on only one side of a first insulating resin layer. The solder resist layer 13 having openings A was formed on the second wiring conductor (the second wiring conductor 10 in FIG. 1F) (see FIG. 6A). Then, the nickel layer 14 and the gold plating layer 15 were laminated and formed in the openings A (see FIG. 6B). Further, solder balls were mounted on the gold plating layer 15, and reflow was performed at about 260° C. to fabricate a multilayer printed wiring board on which the solder balls 16 were formed (see FIG. 6C).

Then, the obtained multilayer printed wiring board and the bare chip 17 on which gold bumps were formed on aluminum electrode portions by a gold wire ball bonding method were aligned, and the bare chip 17 was mounted on the multilayer printed wiring board. Then, the multilayer printed wiring board on which the bare chip 17 was mounted was reflowed at about 260° C. for solder connection, and then washed, and resin sealing was performed with the mold resin 18 (see FIG. 6D). Then, the first insulating resin layer 2 (prepreg layer) was peeled by physical force in a step similar to the peeling step (e) of Example 1 (see FIG. 6E). Further, the ultrathin copper foil 4 and the release layer 3 were removed as in the removal step (f) of Example 1 using a hydrogen peroxide-sulfuric acid-based soft etchant, to obtain the semiconductor device mounting substrate 30 (see FIG. 6F).

In the formation of the semiconductor device mounting substrate 30 of Example 2, unusual places such as blisters were not noted during the reflow, and the alignment of the bare chip 17, and the like could be also performed well.

Comparative Example 3

The semiconductor device mounting substrate of Comparative Example 3 was fabricated as in Example 2 except that the supporting substrate for circuit formation 12 (see FIG. 4A) in Comparative Example 2 was used in the substrate forming step (a) of Example 2. In Comparative Example 3 in which the supporting substrate for circuit formation 12 having no release layer was used, peeling occurred between the copper foil and the ultrathin copper foil during the reflow, and 15 mm copper foil blisters occurred in two places in the substrate (a size of 70 mm×240 mm). Therefore, in the alignment of the bare chip 17, positional displacement occurred, causing product failure.

The entire disclosure of Japanese Patent Application No. 2016-131702 filed on Jul. 1, 2016 and the entire disclosure of Japanese Patent Application No. 2017-005949 filed on Jan. 17, 2017 are incorporated herein by reference.

In addition, all literatures, patent applications, and technical standards described herein are incorporated herein by reference to the same extent as when individual literatures, patent applications, and technical standards being incorporated by reference is specifically and individually described.

REFERENCE SIGNS LIST 1, 12 supporting substrate for circuit formation
2 first insulating resin layer
3 release layer
4 ultrathin copper foil
6 first wiring conductor
7 second insulating resin layer
8 metal layer
9 plating copper
10 second wiring conductor
11 carrier copper
13 solder resist layer
14 nickel layer
15 gold plating layer
16 solder ball
17 bare chip
18 mold resin
20 package substrate for mounting a semiconductor device
30 semiconductor device mounting substrate

The invention claimed is:

1. A method for manufacturing a package substrate for mounting a semiconductor device, comprising:
   (a) forming a supporting substrate for circuit formation comprising a first insulating resin layer, a release layer comprising a silicon compound, and an ultrathin copper foil having a thickness of 1 μm to 5 μm, in this order;
   (b) forming a first wiring conductor on the ultrathin copper foil of the supporting substrate for circuit formation by pattern copper electroplating;
   (c) disposing a second insulating resin layer so as to be in contact with the first wiring conductor, and heating and pressurizing the second insulating resin layer for lamination;
   (d) forming in the second insulating resin layer a non-through hole reaching the first wiring conductor and connecting an inner wall of the non-through hole by copper electroplating and/or electroless copper plating to form a second wiring conductor;
   (e) peeling the first insulating resin layer from the supporting substrate for circuit formation on which the first wiring conductor and the second wiring conductor are formed; and
   (f) removing the release layer and/or the ultrathin copper foil;
   wherein the release layer has a thickness of 10 nm to 80 nm and is directly laminated on the first insulating resin layer with no intervening layer therebetween.

2. The method for manufacturing a package substrate for mounting a semiconductor device according to claim 1, wherein the (b) forming comprises:
   (b-1) laminating a plating resist on the ultrathin copper foil,
   (b-2) forming a wiring circuit pattern in the plating resist by photolithography,
   (b-3) forming the first wiring conductor by pattern copper electroplating on the ultrathin copper foil on which the wiring circuit pattern is formed, and
   (b-4) removing the plating resist.

3. The method for manufacturing a package substrate for mounting a semiconductor device according to claim 1, wherein the lamination step (c) comprises:
   (c-1) subjecting a surface of the first wiring conductor to roughening treatment, and
   (c-2) disposing the second insulating resin layer so as to be in contact with the first wiring conductor subjected to the roughening treatment, further disposing a metal layer on the second insulating resin layer, and performing heating and pressurization to laminate the second insulating resin layer and the metal layer.

4. The method for manufacturing a package substrate for mounting a semiconductor device according to claim 1, wherein the (d) forming comprises:
   (d-1) forming in the second insulating resin layer a non-through hole reaching the first wiring conductor,
   (d-2) connecting an inner wall of the non-through hole by copper electroplating and/or electroless copper plating, and
   (d-3) forming the second wiring conductor by a subtractive method or a semi-additive method.

5. The method for manufacturing a package substrate for mounting a semiconductor device according to claim 1, wherein during the (d) forming, the supporting substrate for circuit formation on which the first wiring conductor and the second wiring conductor are formed is further repeatedly subjected to the (c) lamination and the (d) forming to manufacture a package substrate for mounting a semiconductor device having a buildup structure.

6. The method for manufacturing a package substrate for mounting a semiconductor device according to claim 1, wherein a thickness of the first insulating resin layer is 0.02 mm to 2.0 mm.

7. The method for manufacturing a package substrate for mounting a semiconductor device according to claim 1, wherein during the (d) forming, the non-through hole is formed by a laser.

8. The method for manufacturing a package substrate for mounting a semiconductor device according to claim 1, wherein during the (e) peeling, the first insulating resin layer is physically peeled.

9. The method for manufacturing a package substrate for mounting a semiconductor device according to claim 1, wherein during the (f) removing, the release layer and/or the ultrathin copper foil are removed using a sulfuric acid-based or hydrogen peroxide-based etchant.

10. The method for manufacturing a package substrate for mounting a semiconductor device according to claim 1, wherein the (a) forming comprises (a-1) disposing release layer-attached copper foil in which the release layer is formed on copper foil having a thickness of 1 μm to 20 μm on the first insulating resin layer so that the release layer and the first insulating resin layer are in contact with each other, and then subjecting the copper foil of the release layer-attached copper foil to etching treatment to form the ultrathin copper foil.

11. The method for manufacturing a package substrate for mounting a semiconductor device according to claim 1, wherein the release layer comprises the silicon compound other than a silicone compound.

12. A method for manufacturing a semiconductor device mounting substrate comprising:
   (a) forming a supporting substrate for circuit formation comprising a first insulating resin layer, a release layer comprising at least a silicon compound, and an ultrathin copper foil having a thickness of 1 μm to 5 μm, in this order;
   (b) forming a first wiring conductor on the ultrathin copper foil of the supporting substrate for circuit formation by pattern copper electroplating;
   (c) disposing a second insulating resin layer so as to be in contact with the first wiring conductor, and heating and pressurizing the second insulating resin layer for lamination;
   (d) forming in the second insulating resin layer a non-through hole reaching the first wiring conductor and connecting an inner wall of the non-through hole by copper electroplating and/or electroless copper plating to form a second wiring conductor;
   (g) mounting a semiconductor device on the second wiring conductor;
   (e) peeling the first insulating resin layer from the supporting substrate for circuit formation on which the semiconductor device is mounted on the second wiring conductor; and
   (f) removing the release layer and/or the ultrathin copper foil;
   wherein the release layer has a thickness of 10 nm to 80 nm and is directly laminated on the first insulating resin layer with no intervening layer therebetween.

13. The method for manufacturing a semiconductor device mounting substrate according to claim 12, wherein during the (g) mounting, the semiconductor device is mounted on the second wiring conductor via a joining material.

\* \* \* \* \*